United States Patent [19]

Daly et al.

[11] 4,152,159

[45] May 1, 1979

[54] ACID-RESISTANT COPOLYMER AND PHOTOGRAPHIC ELEMENT INCORPORATING SAME

[75] Inventors: Robert C. Daly, Rochester; Ronald H. Engebrecht, Pittsford, both of N.Y.

[73] Assignee: Eastman Kodak Company, Rochester, N.Y.

[21] Appl. No.: 892,597

[22] Filed: Apr. 3, 1978

Related U.S. Application Data

[63] Continuation of Ser. No. 803,328, Jun. 3, 1977, abandoned, which is a continuation-in-part of Ser. No. 710,992, Aug. 2, 1976, abandoned.

[51] Int. Cl.$^2$ ................................................ G03C 1/68
[52] U.S. Cl. ..................................... 96/86 P; 96/35.1; 526/9; 204/159.22; 96/115 P
[58] Field of Search ................ 96/35.1, 115 R, 115 P, 96/86 P; 526/9; 204/159.22

[56] References Cited

U.S. PATENT DOCUMENTS

| T900,009 | 7/1972 | Dunham et al. | 96/115 |
|---|---|---|---|
| 2,610,120 | 9/1952 | Minsk et al. | 96/35.1 |
| 2,690,966 | 10/1954 | Minsk et al. | 96/35.1 |
| 2,725,372 | 11/1955 | Minsk et al. | 96/35.1 |
| 3,257,664 | 6/1966 | Luebner et al. | 526/9 |
| 3,696,072 | 10/1972 | Reynolds et al. | 260/47 EP |
| 3,821,167 | 6/1974 | Asano | 96/115 |

FOREIGN PATENT DOCUMENTS

| 59327 | 12/1967 | German Democratic Rep. | |
| 1353506 | 5/1974 | United Kingdom | 96/115 |

*Primary Examiner*—John D. Welsh
*Attorney, Agent, or Firm*—Dana M. Schmidt

[57] ABSTRACT

A photocrosslinkable polymer and imaging element containing said polymer are described wherein acid resistance is achieved by vinyl ester recurring units. A process for etching an element so prepared features exposure, development, and etching in an acid bath.

9 Claims, No Drawings

ACID-RESISTANT COPOLYMER AND PHOTOGRAPHIC ELEMENT INCORPORATING SAME

RELATED APPLICATIONS

This is a continuation of application Ser. No. 803,328, filed June 3, 1977 which is a continuation-in-part application of U.S. application Ser. No. 710,992 filed on Aug. 2, 1976, now abandoned.

BACKGROUND OF THE INVENTION

(1) Field of the Invention

The invention relates to a light-sensitive, film-forming polymer useful in making a photographic element, having increased resistance to acids.

(2) State of the Prior Art

Photoresist polymers have been developed containing poly(vinyl cinnamate). An early resist lacquer comprising the homopolymer derived by esterifying poly(vinyl alcohol) with cinnamoyl chloride in pyridine is disclosed in U.S. Pat. No. 2,610,120 and U.S. Pat. No. 2,690,966. The resist polymer has been modified by coesterifying the poly(vinyl alcohol) with other acid compounds, such as dibasic or monobasic phenyl acid salts, as described, for example, in U.S. Pat. No. 2,861,058 and U.S. Pat. No. 3,560,465, respectively, in addition to a cinnamoyl chloride. Further, the cinnamate moiety has been modified by providing for certain substituents on the phenyl radical, as in the aforesaid U.S. Pat. No. 2,861,058. A photoresist is further taught in U.S. Pat. No. 3,696,072 wherein the vinyl cinnamate polymer is further modified by a second ethylenically unsaturated group in conjugation with the unsaturated sites of the cinnamate moiety.

Publications relating to the general background of photo-sensitive polymers include U.S. Pat. No. 3,821,167; Defensive Publication T-900,009; U.S. Pat. No. 2,725,372; British Patent Specification No. 1,353,506; East German Pat. No. 59,237; and Canadian Pat. No. 986,778.

All of the afore-described photoresists provide resistance to acid etches to varying degrees, depending largely on the corrosiveness of the acid used. Because of new high speed etching techniques for materials such as magnesium, photoresists having increased resistance to acids are needed. What is desired then is polymers having increased resistance, when photocrosslinked, to particularly corrosive etches, such as hot nitric acid, so that deep etching can be achieved more quickly without sacrificing image quality.

SUMMARY OF THE INVENTION

The invention concerns a light-sensitive polymer, a photographic element prepared therefrom, and an etching process, the polymer having resistance to corrosive acid etches such as hot nitric acid.

In one aspect the invention features a polymer comprising from about 30 to about 97 mole percent of recurring units having the general structure:

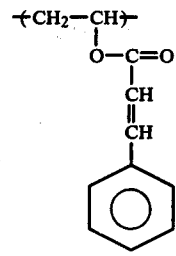

and from about 3 to about 70 mole percent of recurring units having the general structure:

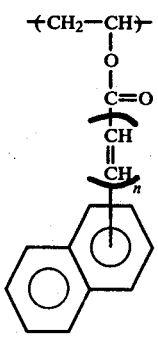

where n is 0 or 1.

In another aspect, this invention features a polymer comprising the repeating units

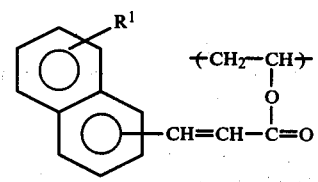

wherein $R^1$ is hydrogen or a lower alkyl or alkoxy radical containing from 1 to 5 carbon atoms.

In yet another aspect, this invention features a light-sensitive film-forming polymer comprising from about 3 to about 70 mole percent of recurring units having the general structure

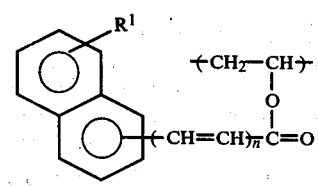

where n = 1 or 0, and $R^1$ is hydrogen or a lower alkyl or alkoxy radical containing from 1 to 5 carbon atoms; and from about 30 to about 97 mole percent of recurring units having the general structure

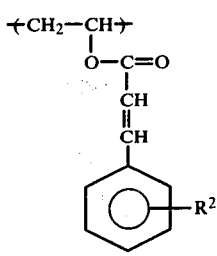

wherein R² is hydrogen, a lower alkyl radical containing from 1 to 5 carbon atoms, a halogen radical, or a nitro radical in the meta or ortho positions.

In still another aspect, the invention features a photographic element comprising any of these polymers on a suitable support.

The process of the invention, to prepare an etched element, comprises the steps of imagewise exposing to activating radiation an element comprising a support, coated on the support, a light-sensitive film-forming polymer comprising from about 3 to about 70 mole percent of recurring units having the general structure

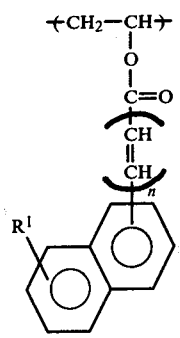

and from about 30 to about 97 mole percent of recurring units having the general structure

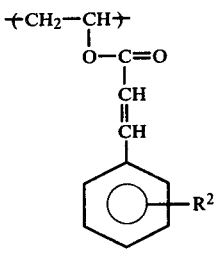

where n is 0 or 1 and R¹ and R² are as defined above;

and a thiazoline sensitizer in admixture with said polymer;

removing the unexposed portions of said polymer by washing the element in a developer solution;

and subjecting the element to an acid bath for a time and at a temperature sufficient to etch the portions of the support not coated with the polymer.

DESCRIPTION OF THE PREFERRED EMBODIMENTS

As described in the afore-discussed prior art, useful photoresists have been provided in the past by esterifying poly(vinyl alcohol) with at least a cinnamoyl acid chloride. It has been discovered that a photosensitive copolymer having enhanced acid resistance, particularly useful in photoresist applications, is achieved by co-esterifying at least a portion of poly(vinyl alcohol) with a naphthoyl acid chloride or a 3-(naphthyl)acryloyl chloride, as well as with a cinnamoyl chloride, to provide a copolymer containing as dependent moieties both a cinnamate crosslinking moiety, and a naphthoate or 3-(naphthyl)acrylate moiety.

More specifically, useful light-sensitive film-forming polymers, in accordance with the invention, comprise those containing from about 30 to about 97 mole percent of recurring units (I) having the general structure

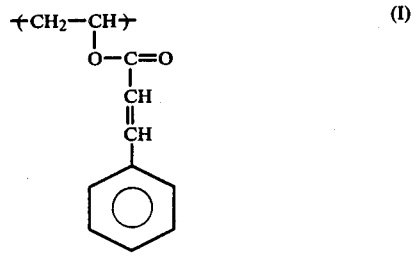

and from about 3 to about 70 mole percent of recurring units having the general structure

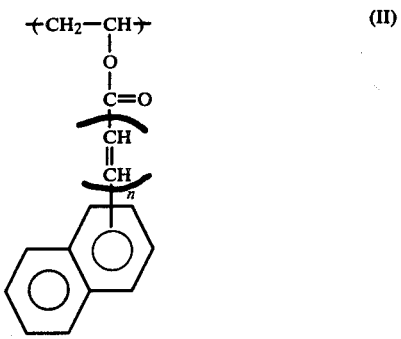

where n is 0 or 1. It has been found that if the naphthoate recurring unit exceeds 70 mole percent of the copolymer, the crosslinkability of the cinnamate becomes significantly impaired.

In addition, it is contemplated that full equivalents of the afore-described copolymers, for this invention, are those wherein the recurring units are those having the formulas

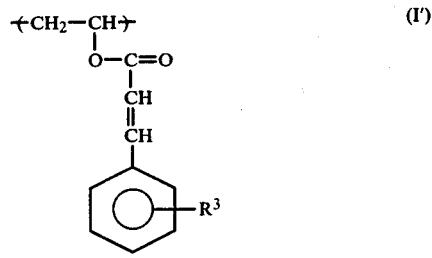

wherein R³ is a lower alkyl radical preferably containing from 1 to 5 carbon atoms, such as methyl, ethyl, propyl, etc.; a halogen radical, for example, chloride, bromide and the like; or a nitro radical in a position other than the para position; and

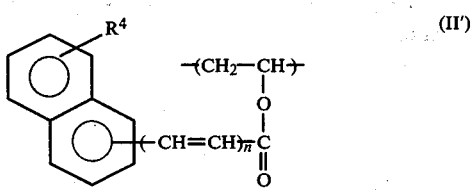

(II')

with n having the value noted above, wherein $R^4$ is a lower alkyl or alkoxy radical preferably containing from 1 to 5 carbon atoms, for example, methyl, ethyl, propyl, methoxy, ethoxy, propoxy, and the like. It is further contemplated that the copolymer of the invention can contain other vinyl ester repeating units, such as the additional repeating unit

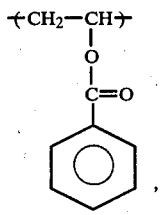

the mole percent of such benzoate recurring unit being no more than about 10%. Such additional repeating units can be produced by adding the proper mole ratio of benzoyl chloride to poly(vinyl alcohol), following the procedures hereinafter discussed.

Still another contemplated equivalent is a homopolymer of repeating unit (II') above, with n=1.

Such polymers will produce, upon exposure to light rich in UV, and development, a crosslinked copolymer resistant to hot concentrated nitric acid for a time period sufficient to provide a "deep etch" of the support underlying what was the nonexposed areas of the polymer. "Deep etch" as used herein, means an etch sufficient to remove at least 370 microns of the support. Removal of as much as 1000 microns is common. The actual time period for such acid etch will of course vary, depending upon the material comprising the support.

The above-described copolymers can be prepared by the sequential addition, in either order, of a naphthoyl acid halide or a 3-(naphthyl)acryloyl acid halide and cinnamoyl acid halide to a suspension of poly(vinyl alcohol) (hereinafter, PVA) in a tertiary amine solvent such as pyridine, to esterify the alcohol groups. The mole ratio of added reactants is adjusted to achieve the desired mole percent of the copolymer recurring units. The sequence of addition of the acid chlorides can be modified even to the extent of adding them altogether or adding first a portion of the first acid chloride, all of the second, and then the remainder of the first. Except as noted above with regard to the sequence of addition, the conditions of the reactions, such as temperatures and times, can be those of the art, such as those disclosed in the aforesaid U.S. Pat. No. 3,560,465, the disclosure of which is expressly incorporated herein by reference. In addition, the following preparations are set forth as nonlimiting examples:

Preparation No. 1 of Poly[vinyl cinnamate-co-vinyl α-naphthoate] 50:50

A pyridine (300 ml) suspension of 13.7 g "Elvanol 71-30-M" PVA [a medium molecular weight poly(vinyl alcohol), 100% hydrolyzed, manufactured by DuPont] was stirred at 60° C. for 16 hours to swell the polymer. The suspension was cooled to 50° C. and 28.5 g α-naphthoyl chloride was added. After stirring 6 hours at 50° C. 25 g of cinnamoyl chloride was added. Warming was continued for another 16 hours after which the solution was cooled. The reaction mixture was precipitated into water and the resultant fiberous polymer washed thoroughly with water and dried to give 41.8 g of polymer. The product was readily soluble in solvents such as cyclohexanone and 1,2-dichloroethane.

Preparation No. 2 of Poly[vinyl cinnamate-co-vinyl β-naphthoate] 80:20

"Elvanol 71-30-M" PVA (4.4 g) was suspended in 150 ml of pyridine at 60° C. for 16 hours. The suspension was cooled to 50° C. and 3.8 g of β-naphthoyl chloride was added. Stirring at 50° C. continued for 6 hours after which 12.4 g of cinnamoyl chloride was added. The reaction mixture was warmed at 50° C. for 16 hours, then cooled and filtered. The polymer solution was precipitated into water and thoroughly washed with water. After drying, 13.4 g of polymer was obtained.

Preparation No. 3 of Poly[vinyl cinnamate-co-vinyl α-naphthoate-co-vinyl acetate] 44:44:12

"Vinol 523" PVA (4.9 g), a medium molecular weight poly(vinyl alcohol), 88% hydrolized from poly(vinyl acetate), manufactured by Air Products, was suspended in 150 ml of pyridine at 60° for 16 hours. The suspension was cooled to 50° C. and 8.4 g of α-naphthoyl chloride was added. After additional warming for 6 hours, 7.3 g of cinnamoyl chloride was added and the reaction mixture warmed for 16 hours. The cool solution was filtered and precipitated into water. The resulting fiberous product was dried, giving 9.8 g of product.

Preparation No. 4 of Poly[vinyl cinnamate-co-vinyl 3-(α-naphthyl)acrylate] (50:50)

"Elvanol 71-30-M" PVA (4.4 gm) was suspended in 150 ml of pyridine at 60° C. for 16 hours. The suspension was cooled to 50° C. and 8.4 g of cinnamoyl chloride was added. The reaction mixture was stirred at 50° C. for 6 hours after which 10.9 g of 3-(α-naphthyl)acryloyl chloride was added. The reaction mixture was then stirred at 50° C. for 12 hours followed by 4 hours at 75° C. The amber, viscous solution was cooled and filtered. The resulting dope was then precipitated into vigorously stirred water. The resulting polymer was collected and blended with water in a high speed Waring blender. The polymer, consisting of small granules, was dried at 50° for 4 days in an air oven to a final weight of 14.2 g.

Preparation No. 5 of Poly(vinyl cinnamate-co-vinyl α-naphthoate) (95:5)

The copolymer was prepared as in Preparation No. 1 except that 1.0 g naphthoyl chloride and 15.9 g cinnamoyl chloride were added to 4.4 g of "Elvanol 71-30-M" in 150 ml of pyridine. A slightly off-white granular polymer was obtained in a dry yield of 13.1 g.

Preparation No. 6 of Poly[vinyl cinnamate-co-vinyl 3-(4-methoxy-1-naphthyl)acrylate] (50:50)

The copolymer was prepared as in Preparation No. 1 except that 6.25 g 3-(4-methoxy-1-naphthyl)acryloyl chloride and 4.15 g cinnamoyl chloride were added to 2.2 g "Elvanol 71-30-M" in 70 ml of pyridine. The yellowish polymer was isolated in a yield of 8.2 g.

It is common for poly(vinyl alcohol) to be acetylated to a certain degree, so that the final copolymers described above may have up to as much as 25 mole percent acetate groups, without adversely affecting the copolymer photoresist properties. For example, as noted in Preparation No. 3 above, the "Vinol 523" poly(vinyl alcohol) has a theoretical acetate content of 10 to 15%. Small amounts of free hydroxyls may also be present.

Because of the aforesaid properties, the abovedescribed polymer can be conveniently utilized as a photographic element of several types, e.g., as a photoresist element to form a relief plate or an electronic circuit component, or as a coating for a lithographic plate. When used as a lithoplate, the polymer preferably further includes a sensitizer and a pigment in admixture with the copolymer, and a support on which the copolymer and its addenda are coated. Where used as a lithographic coating, the polymer can further include a print-out dye former and accelerator incorporated in and intermixed with the polymer.

Suitable sensitizers for the copolymer include anthrones, such as 1-carbethoxy-2-keto-3-methyl-3-azabenzanthrone, benzanthrone and those anthrones disclosed in U.S. Pat. No. 2,670,285; nitro sensitizers such as those disclosed in U.S. Pat. No. 2,610,120; triphenylmethanes such as those disclosed in U.S. Pat. No. 2,690,966; quinones such as those disclosed in U.S. Pat. No. 2,670,286; cyanine dye sensitizers; naphthone sensitizers such as 6-methoxybeta-2-furyl-2-acrylonaphthone; pyrylium or thiapyrylium salts, such as 2,6-bis(p-ethoxyphenyl)-4-(p-n-amyloxyphenyl)-thiapyrylium perchlorate and 1,3,5-triphenylpyrylium fluoroborate; furanone; anthraquinones such as 2-chloroanthraquinone; thiazoles such as 2-benzoylcarbethoxymethylene-1-methyl-betanaphthothiazole and methyl 2-(N-methylbenzothiazolylidene) dithioacetate; methyl 3-methyl-2-benzothiazolidene dithioacetate; thiazolines such as 3-ethyl-2-benzoylmethylenenaphthol[1,2-d]-thiazoline, benzothiazoline, 2-[bis(2-furoyl)methylene]-1-methyl naphtho[1,2-d]thiazoline, (2-benzoylmethylene)-1-methylbeta-naphthothiazoline; 1,2-dihydro-1-ethyl-2-phenacylidene-naphthol[1,2-d]-thiazole; naphthothiazoline; quinolizones; Michler's ketone; and Michler's thioketone as well as other sensitizers, such as those disclosed in French Pat. Nos. 1,238,262; 1,089,290 and 1,086,257 and U.S. Pat. Nos. 2,732,301; 2,670,285 and 2,732,301; and nitro aromatics such as nitroacenaphthalene.

The crosslinkable copolymers of this invention, such as those incorporating one or more of the cinnamate repeating units, are directly responsive to actinic radiation. The sensitizers noted above enhance this responsiveness and in some instances appear to extend the wavelength of response of the copolymer.

It is further contemplated that the crosslinkable copolymers of this invention need not be directly crosslinked in response to exposure to actinic radiation. Certain radiation-responsive sensitizers should act as crosslinking agents, such as ketone-type and azide-type sensitizers. Typical aryl ketone sensitizers of this class include such compounds as benz(a)-anthracene-7,12-dione and 4,4'-bis(dimethylamino)-benzophenone. Other advantageous ketone-type sensitizers are, for example, 4,4'-tetraethyldiaminodiphenyl ketone, dibenzalacetone and 4,4'-bis(dimethylamino)-benzophenone imide, as well as additional sensitizers of the type described in U.S. Pat. No. 2,670,287.

Another class of sensitizers for the photocrosslinkable polymers of the invention are coumarins which have an absorptive maximum between about 250 to about 550 nm. These coumarins preferably have the formula:

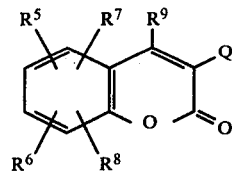

wherein Q is —CN or —Z—R$^{10}$ in which Z is a linking group selected from carbonyl, sulfonyl, sulfinyl or arylenedicarbonyl.

R$^{10}$ is alkyl having 1-10 carbon atoms such as, for example, methyl, ethyl, propyl, isopropyl, tert. butyl, isobutyl, butyl, amyl, hexyl, heptyl, octyl, nonyl, decyl, including cycloalkyl such as cyclopentyl, cyclohexyl, etc., substituted alkyl, etc.; aryl such as phenyl, substituted aryl with substituents such as nitro, alkoxy, halogen, carboalkoxy, alkyl, aryl, carboxy, hydroxy, amino, substituted amino such as dialkylamino, trialkylammonium, etc.; alkoxy such as methoxy, ethoxy, butoxy etc.; aryloxy such as phenoxy, etc.; a heterocyclic group having about 5 to 15 nuclear carbon and hetero atoms such as pyridyl and pyridinium having the formula:

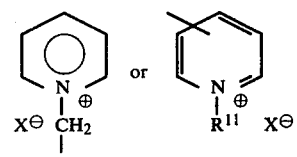

in which R$^{11}$ is alkyl having 1-4 carbon atoms including methyl, ethyl, propyl, isopropyl, butyl, n-butyl, isobutyl, sec.-butyl, etc.; and X$^{\ominus}$ is an anion including FSO$_3^{\ominus}$, BF$_4^{\ominus}$, p-toluene sulfonate, halogen, e.g. Cl$^{\ominus}$, Br$^{\ominus}$, I$^{\ominus}$, etc.;

nicotinyl, nicotinium, furyl, 2-benzofuranyl, 2-thiazolyl, 2-thienyl, etc.;

or a 3-coumarinyl having the formula:

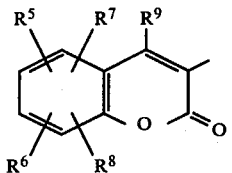

and wherein R$^5$, R$^6$, R$^7$ and R$^8$ each independently is hydrogen, alkoxy having 1-6 carbon atoms, dialkylamino with each alkyl of the dialkylamino group having 1-4 carbon atoms, halogen, nitro, or a 5- or 6-membered heterocyclic group such as pyrrolidino, morpholino, pyperidino, pyridinium, etc.; and R$^9$ is hydrogen, alkyl having 1-4 carbon atoms or aryl of 6-12 carbon atoms; it being noted that two or three of R$^5$–R$^8$ and the nuclear carbon atoms to which they are attached can together form a fused ring or fused ring system, each ring being a 5- or 6-membered ring.

Typical courmarins which are useful herein are for example:

3-benzoyl-5,7-dimethoxycoumarin
3-benzoyl-7-methoxycoumarin 3-benzoyl-6-methoxycoumarin
3-benzoyl-8-ethoxycoumarin
7-methoxy-3-(p-nitrobenzoyl)coumarin
3-benzoylcoumarin
3-(p-nitrobenzoyl)coumarin
3-benzoylbenzo[f]coumarin
3,3'-carbonylbis(7-methoxycoumarin)
3-acetyl-7-methoxycoumarin
3-benzoyl-6-bromocoumarin
3,3'-carbonylbiscoumarin
3-benzoyl-7-dimethylaminocoumarin
3,3'-carbonylbis(7-diethylaminocoumarin)
3-carboxycoumarin
3-carboxy-7-methoxycoumarin
3-ethoxycarbonyl-6-methoxycoumarin
3-ethoxycarbonyl-7-methoxycoumarin
3-acetylbenzo[f]coumarin
3-acetyl-7-methoxycoumarin      3-(1-adamantoyl)-7-methoxycoumarin
3-benzoyl-7-hydroxycoumarin
3-benzoyl-6-nitrocoumarin
3-benzoyl-7-acetoxycoumarin
3-benzoyl-7-diethylaminocoumarin
7-dimethylamino-3-(4-iodobenzoyl)coumarin
7-diethylamino-3(4-iodobenzoyl)coumarin
7-methoxy-3-(4-methoxybenzoyl)coumarin
3-(4-nitrobenzoyl)benzo[f]coumarin
3-(4-ethoxycinnamoyl)-7-methoxycoumarin
3-(4-dimethylaminocinnamoyl)coumarin
3-(4-diphenylaminocinnamoyl)coumarin
3-[(3-methylbenzothiazol-2-ylidene)acetyl]coumarin
3-[(1-methylnaphtho[1,2-d]thiazol-2-ylidene)acetyl]coumarin
3,3'-carbonylbis(6-methoxycoumarin)
3,3'-carbonylbis(7-acetoxycoumarin)
3,3'-carbonylbis(7-dimethylaminocoumarin)
3-cyano-6-methoxycoumarin
3-cyano-7-methoxycoumarin
7-methoxy-3-phenylsulfonylcoumarin
7-methoxy-3-phenylsulfinylcoumarin
1,4-bis(7-diethylamino-3-coumarylcarbonyl)benzene
7-diethylamino-5',7'-dimethoxy-3,3'-carbonylbiscoumarin
7-dimethylamino-3-thenoyl coumarin
7-diethylamino-3-furoyl coumarin
7-diethylamino-3-thenoyl coumarin
3-benzoyl-7-(1-pyrrolidinyl)coumarin
5,7,6'-trimethoxy-3,3'-carbonylbiscoumarin
5,5,7'-trimethoxy-3,3'-carbonylbiscoumarin
7-diethylamino-6'-methoxy-3,3'-carbonylbiscoumarin
3-nicotinoyl-7-methoxycoumarin
3-(2-benzofuranylcarbonyl)-7-methoxycoumarin
3-(7-methoxy-3-coumarinoyl)-1-methylpyridinium fluorosulfate
3-(5,7-diethoxy-3-coumarinoyl)-1-methylpyridinium fluoroborate
N-(7-methoxy-3-coumarinoylmethyl)pyridinium bromide
9-(7-diethylamino-3-coumarinoyl)-1,2,4,5-tetrahydro-3H,6H,10H[1]benzopyrano[9,9a,1-gh]quinolazine-10-one, i.e.,

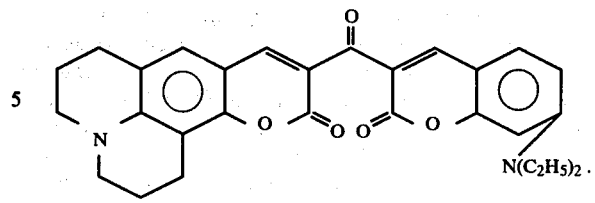

Preparations of organocarbonyl coumarins are found in *Chemical Reviews*, 36 1, (1945), S. M. Sethna and N. H. Shah; R. K. Pandya and K. C. Pandya *Agr. Univ. J. Research* 4, 345 (1955) C. A. 52, 7307b. Bis compounds are described in L. L. Woods and M. Fooladi *J. Chem. Eng. Data* 12, 624 (1967).

The sensitizer can be present in the coating composition in any desired concentration effective to stimulate crosslinking in response to radiation or can be omitted entirely where the crosslinkable polymer is itself radiation-sensitive. It is generally preferred to incorporate the sensitizer in a concentration of from 0.01 to 20 percent by weight based on the weight of the crosslinking polymer.

Pigments for the copolymer, usually selected to aid in visually comparing the developed image areas with the nonimage areas, include the following: Victoria Blue (Color Index Pigment Blue I), Palomar Blue (Color Index Pigment Blue 15), Monastral Blue BF (Color Index Pigment Blue 15 (74160)), and Watchung Red B (Color Index Pigment Red 48).

Suitable support materials for the copolymers of the invention can be chosen from among a variety of materials which do not directly chemically react with the coating composition. The particular material chosen will depend upon the end photographic use. Such support materials include fiber base materials such as paper, polyethylene-coated paper, polypropylene-coated paper, parchment, cloth, etc.; sheets and foils of such metals as aluminum, copper, magnesium, zinc, etc.; glass and glass coated with such metals as chromium, chromium alloys, steel, silver, gold, platinum, etc.; synthetic resin and polymeric materials such as poly(alkyl acrylates), e.g., poly(methyl methacrylate), polyester film base—e.g., poly(ethylene terephthalate), poly(vinyl acetals), polyamides—e.g., nylon and cellulose ester film base—e.g., cellulose nitrate, cellulose acetate, cellulose acetate propionate, cellulose acetate butyrate and the like.

Of these, particularly useful support materials for photoresist etching include magnesium and copper. Specific support materials which are useful in forming printing plates, particularly lithographic printing plates, include supports such as zinc, aluminum, copper and specially prepared metal and paper supports; superficially hydrolyzed cellulose ester films; and polymeric supports such as polyolefins, polyesters, polyamide, etc.

For lithographic uses, the supports can be preliminary coated—i.e.; before receipt of the radiation-sensitive coating—with known subbing layers such as copolymers of vinylidene chloride and acrylic monomers—e.g., acrylonitrile, methyl acrylate, etc. and unsaturated dicarboxylic acids such as itaconic acid, etc.; carboxymethyl cellulose; gelatin; polyacrylamide; and similar polymer materials. The support can also carry a filter or antihalation layer compound of a dyed polymer layer which absorbs the exposing radiation after it passes through the radiation-sensitive layer, thus eliminating unwanted reflection from the support.

The coating compositions also can include a variety of other photographic addenda utilized for their known purpose, such as agents to modify the flexibility of the coating, agents to modify its surface characteristics, agents to modify the adhesivity of the coating to the support, antioxidants, preservatives, and phenolic resins, such as thermoplastic "Novalac" resins or solvent-soluble resole resins incorporated in the composition to improve the resistance of the polymer composition to etchants when it is used as a photoresist.

Coating compositions containing the light-sensitive polymers of this invention can be prepared by dispersing or dissolving the polymer in any suitable solvent or combination of solvents used in the art to prepare polymer dopes. Solvents that can be used to advantage include ketones such as 2-butanone, 4-methyl-2-pentanone, cyclohexanone, 4-butyrolactone, 2,4-pentandione, 2,5-hexandione, etc.; esters such as 2-ethoxyethyl acetate, 2-methoxyethyl acetate, n-butyl acetate, etc.; chlorinated solvents such as chloroform, dichloroethane, trichloroethane, tetrachloroethane, etc.; as well as dimethylformamide and dimethylsulfoxide; and mixtures of these solvents. Typically the light-sensitive copolymer is employed in the coating composition in the range from about 1 to 30 percent by weight. Preferably the copolymer comprises 5 to 20 percent by weight of the composition in a solvent such as listed above.

As used herein, "coating" refers to any application of a layer of the copolymer, with its addenda, to a support, such as by conventional coating techniques, lamination of preformed layers, or by any other means of strata formation. Using such conventional coating techniques, the composition can be sprayed, brushed, applied by a roller or immersion coater, flowed over the surface, picked up by immersion, impregnated or spread by other means. Elements thus formed are dried at room temperature, under vacuum or at elevated temperature. Typical coating thicknesses can be from about 0.05 to 10.0 microns or greater, and will vary depending upon the photographic use. For photoresist use, the coating is preferably from 1 to about 5 microns thick, and thicknesses of from 0.1 to 2.5 microns are preferred for lithographic plate applications.

Photomechanical images can be prepared with photosensitive elements of the invention by imagewise exposing the element to a light source to harden or insolubilize the polymer in exposed areas. Suitable light sources which can be employed in exposing the elements include sources rich in visible radiation and sources rich in ultraviolet radiation, such as carbon arc lamps, mercury vapor lamps, fluorescent lamps, tungsten lamps, photoflood lamps, and the like.

The exposed element can be developed with a solvent for the unexposed, uncrosslinked polymer which is a non-solvent for the exposed hardened polymer. Such solvents can be selected from the solvents listed above as suitable coating solvents as well as others well known in the art. Such development is conventional, so that further details are unnecessary.

When the developed element is used in acid etching, a 1 to 5 minute treatment in an acid such as hot 20% nitric acid, depending on the depth of etching required, at a temperature of from 100° to 150° F., produces excellent relief images significantly free from acid attack in the raised portions protected by the copolymer.

EXAMPLES

The following nonexhaustive examples are further illustrative of the invention:

EXAMPLE 1

A coating composition was prepared as follows:

| | |
|---|---|
| 10.0 g | the copolymer of Preparation No. 1 |
| 5.0 g | 4-butyrolactone |
| 35.0 g | 2-ethoxyethyl acetate |
| 100.0 mg | hydroquinone (a thermal stabilizer) |
| 200.0 mg | 2-[bis(2-furoyl)methylene]-1-methylnaphtho[1,2-d]thianoline |

The photoresist was stirred for 24 hours and filtered through a 2-4 micron pore size filter disk. To 30 g of the filtered composition was added 2.0 g of the following pigment formulation:

| | |
|---|---|
| Monastral Blue BF | 15.68% |
| "FC-98" (a $C_8F_{17}$ fluorocarbon sulfate, anionic surfactant, believed to be a potassium salt, manufactured by 3M Corp.) | 0.38% |
| 2-Ethoxyethyl acetate | 84.0 % |

This composition was roller coated on Dowetch Deadline PRC magnesium plate via a Gyrex Micro-9 roller coater using a roller with a pressure setting of 2.5 pounds and an interference setting of 35. Double passing the plate through the rollers with a 30-second dwell yielded a dry resist coating of 3.25 microns. The plates were prebaked for 10 minutes at 80° C. and exposed to a 200-watt mercury-vapor lamp in an "Exposure I" light unit manufactured by Colight, Inc., Minneapolis, Minnesota for one minute through a KODAK T-14 stepwedge. The exposed portion yielded insoluble resist (under the 9th step (1.2 density)) after 30 second spray development in a hot trichloroethylene. The imaged magnesium plate was then etched with 20% nitric acid in a "Dynamil" spray etcher for 2 minutes at 120° F. The nitric acid etchant was prepared as follows:

| Etchant Formula | |
|---|---|
| 6000 ml | Distilled water |
| 400 ml | Hunt Auto-Express Etching Additive Manufactured by Hunt Chemical Corporation |
| 1600 ml | Concentrated nitric acid |

The nitric acid consumed during etching was replaced by the addition of 6 ml of concentrated nitric acid for each gram of magnesium reacted.

The resist coating yielded excellent protection for the magnesium. No sign of resist chipping, blistering or pinholing was observed after etching to a depth of 625 microns.

EXAMPLE 2

A coating composition was prepared as follows:

| | |
|---|---|
| 2.0 g | Copolymer of Preparation No. 2 |
| 3.6 g | 4-Butyrolactone |
| 11.0 g | 2-Ethoxyethyl acetate |
| 20.0 mg | Hydroquinone |
| 40.0 g | 2-(Benzoylmethylene)-1-methyl-naphtho[1,2-d]-thiazoline |

The above materials were mixed 24 hours and filtered through a 2-4 micron pore size disk filter.

The filtered composition was whirl-coated at 115 rpm yielding 3.75 micron dry coatings on PRC magnesium. The plates were exposed for 2 minutes to a Kodak T-14 stepwedge and processed as in Example 1 to develop 8 clear steps, yielding excellent etched images.

EXAMPLE 3

A resist composition was prepared as follows:

| | |
|---|---|
| 2.0 g | Copolymer of preparation No. 4 |
| 4.0 g | 4-butyrolactone |
| 12.0 g | 2-ethoxyethyl acetate |
| 20.0 mg | hydroquinone |
| 40.0 mg | 3,3'-caerbonylbis (7-diethylaminoconmarin) |

A plate was prepared as in Example 1, was exposed for 30 seconds to the T-14 stepwedge, and was processed as in Example 2. Although the imaging quality of the coating was initially less than that of Example 1, the resist image withstood the nitric acid etchant equally as well as the resist of Example 1.

EXAMPLE 4

A coating composition of the copolymer from Preparation No. 5 and a plate were prepared in the manner of Example 1. The resulting plate was exposed as in Example 1 and developed to give a 9th step insoluble resist from a Kodak T-14 stepwedge, and etched also as in Example 1 of the application. The etched image was judged good to excellent compared to a poly(vinyl cinnamate) control which was judged poor to fair with extensive chipping.

EXAMPLE 5

A coating composition of the copolymer from Preparation No. 6 and a plate were prepared in the manner of Example 3 except using 3,3'-carbonylbis(5,7-dipropoxy coumarin) as the sensitizer. The resulting plate was exposed, and developed as in Example 1 of the application to give a 7th step insoluble resist from a Kodak T-14 stepwedge, and etched also as in Example 1 of the application. The etched image was judged excellent with no chipping or blistering.

Comparative Examples

The following examples, submitted by way of comparison, indicate the superiority of the acid resistance of the copolymers of the invention.

Comparative Example No. 1

A coating was prepared as in Example 1, except that an equivalent amount of Kodak "Photo Resist Type 4," a homopolymer of poly(vinyl cinnamate), was used in place of the copolymer. After exposure, development, and etching as in Example 1, the "protected" areas were found to be chipped, blistered and pinholed.

Comparative Example No. 2

A coating was prepared as in Example 1, except that an equivalent amount of a copolymer comprising 50 mole percent benzoate in place of the 50 mole percent α-naphthoate was used, to show the importance of the presence of the added aromatic carbon atoms. The photoresist containing the benzoate was evaluated as described for Example 1, and it was found that the exposed "protective" coating sloughed off during the acid etch, permitting etching of the exposed areas. Thus, the benzoate copolymer did not give the excellent acid resistance available with the naphthoate copolymer.

The invention has been described in detail with particular reference to certain preferred embodiments thereof, but it will be understood that variations and modifications can be effected within the spirit and scope of the invention.

What is claimed is:

1. A photographic element having a coating exhibiting superior acid etch resistance when photohardened, the element comprising
    a support, and coated on the support,
    a light-sensitive film-forming polymer comprising from about 30 to about 97 mole percent of recurring units having the general structure

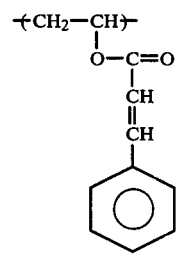

and from about 3 to about 70 mole percent of recurring units having the general structure

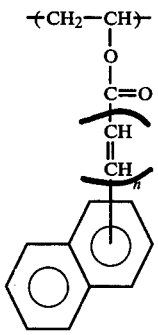

where n is 0 or 1, and a sensitizer in admixture with said polymer.

2. An element as defined in claim 1, wherein from about 3 to about 70 mole percent of said polymer comprises recurring units having the general structure

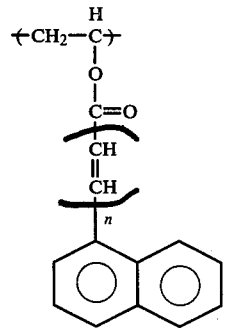

where n=0 or 1.

3. An element as defined in claim 1, wherein from about 3 to about 70 mole percent of said polymer comprises recurring units having the general structure:

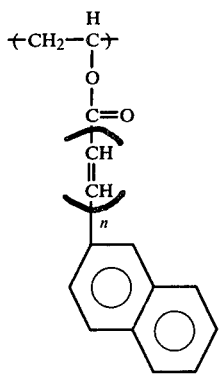

where n=0 or 1.

4. An element as defined in claim 1, and further including a pigment in admixture with said polymer.

5. A photographic element having a coating exhibiting superior acid etch resistance when photohardened, the element comprising a support, and coated on the support, a light-sensitive film-forming polymer comprising from about 3 to about 70 mole percent of recurring units having the general structure

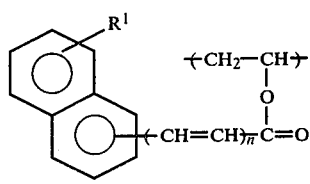

wherein n=1 or 0, and $R^1$ is hydrogen or alkyl or alkoxy containing from 1 to 5 carbon atoms;

and from about 30 to about 97 mole percent of recurring units having the general structure

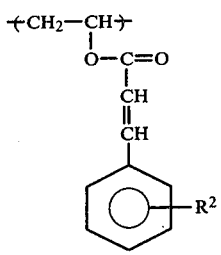

wherein $R^2$ is hydrogen, alkyl containing from 1 to 5 carbon atoms, halogen, or nitro in the meta or ortho positions;

and a sensitizer in admixture with said polymer.

6. A photographic element having a coating exhibiting superior acid etch resistance when photohardened, the element comprising a support, and coated on the support, a light-sensitive film-forming polymer comprising the repeating units

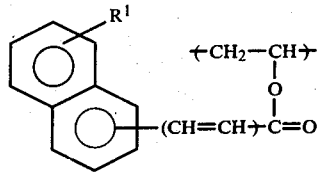

wherein $R^1$ is hydrogen, or alkyl or alkoxy containing from 1 to 5 carbon atoms;

and a sensitizer in admixture with said polymer.

7. A photographic element having a coating exhibiting superior acid etch resistance when photohardened, the element comprising a support, and coated on the support, a light-sensitive film-forming polymer comprising from about 30 to about 97 mole percent of recurring units having the general structure

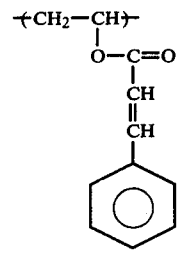

and from about 3 to about 70 mole percent of recurring units having the general structure

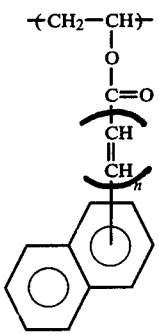

where n is 0 or 1, and a sensitizer in admixture with said polymer.

8. A photographic element having a coating exhibiting superior acid etch resistance when photohardened, the element comprising a support, and coated on the support, a light-sensitive film-forming polymer comprising from about 3 to about 70 mole percent of recurring units having the general structure

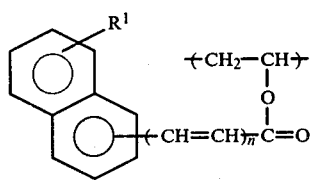

wherein n=1 or 0, and $R^1$ is hydrogen or alkyl or alkoxy containing from 1 to 5 carbon atoms;

and from about 30 to about 97 mole percent of recurring units having the general structure

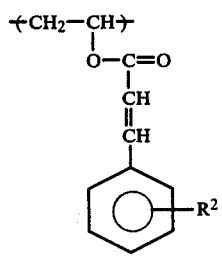

wherein $R^2$ is hydrogen, alkyl containing from 1 to 5 carbon atoms, halogen, or nitro in the meta or ortho positions;

and a sensitizer in admixture with said polymer.

9. A photographic element having a coating exhibiting superior acid etch resistance when photohardened, the element comprising a support, and coated on the support, a light-sensitive film-forming polymer comprising the repeating units

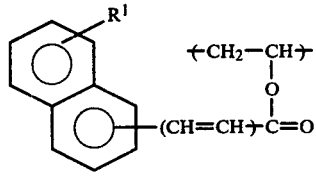

wherein $R^1$ is hydrogen or alkyl or alkoxy containing from 1 to 5 carbon atoms;

and a sensitizer in admixture with said polymer.

* * * * *

UNITED STATES PATENT AND TRADEMARK OFFICE
CERTIFICATE OF CORRECTION

PATENT NO. : 4,152,159
DATED : May 1, 1979
INVENTOR(S) : Robert C. Daly and Ronald H. Engebrecht It is certified that error appears in the above-identified patent and that said Letters Patent are hereby corrected as shown below:

Column 16, lines 51-67, delete.

Column 17, lines 1-19, delete.

Column 18, lines 1-18, delete.
On the title page under the Abstract, "9 claims" should read
--- 7 ---.

Signed and Sealed this

Sixth Day of November 1979

[SEAL]

Attest:

RUTH C. MASON
Attesting Officer

LUTRELLE F. PARKER
Acting Commissioner of Patents and Trademarks